United States Patent
Koch et al.

(10) Patent No.: US 9,397,708 B2
(45) Date of Patent: Jul. 19, 2016

(54) METHOD AND SYSTEM FOR FLEXIBLE RADIO COMMUNICATIONS USING A WIDEBAND RADIO AND SEPARABLE RADIO DEFINITION MODULE

(71) Applicant: TrellisWare Technologies, Inc., San Diego, CA (US)

(72) Inventors: Robert Ian Koch, Santee, CA (US); James F. Morse, Poway, CA (US)

(73) Assignee: TrellisWare Technologies, Inc., San Diego, CA (US)

( * ) Notice: Subject to any disclaimer, the term of this patent is extended or adjusted under 35 U.S.C. 154(b) by 79 days.

(21) Appl. No.: 14/533,036

(22) Filed: Nov. 4, 2014

(65) Prior Publication Data

US 2016/0126981 A1 May 5, 2016

(51) Int. Cl.
*H04B 1/00* (2006.01)
*H03J 5/24* (2006.01)
*H04B 1/40* (2015.01)

(52) U.S. Cl.
CPC .............. *H04B 1/0057* (2013.01); *H03J 5/242* (2013.01); *H04B 1/40* (2013.01)

(58) Field of Classification Search
None
See application file for complete search history.

(56) References Cited

U.S. PATENT DOCUMENTS

| | | | | |
|---|---|---|---|---|
| 6,690,947 | B1* | 2/2004 | Tom | H04M 1/72525 455/418 |
| 8,670,800 | B2* | 3/2014 | Liu | H04M 1/72575 455/557 |
| 2002/0173339 | A1* | 11/2002 | Safadi | H03J 9/00 455/553.1 |
| 2004/0204028 | A1* | 10/2004 | Kotzin | H04B 1/3816 455/551 |
| 2012/0142398 | A1* | 6/2012 | Tamaoka | H01Q 1/243 455/557 |
| 2014/0065982 | A1* | 3/2014 | Suh | H04B 1/006 455/77 |

* cited by examiner

Primary Examiner — Alejandro Rivero
(74) Attorney, Agent, or Firm — Kilpatrick Townsend & Stockton LLP

(57) ABSTRACT

A method and system for flexible radio communications using a wideband radio includes a wideband radio and multiple separable radio definition modules, wherein the wideband radio is configured to operate over a large portion of the radio-frequency (RF) spectrum and each of the radio definition modules are configured to operate in a specific frequency band. The separability of the radio definition modules maintains the capability of the wideband radio to operate over the large portion of the RF spectrum, as well as enabling its robust and reliable operation in a specific frequency band associated with the attached radio definition module.

20 Claims, 6 Drawing Sheets

METHOD AND SYSTEM FOR FLEXIBLE RADIO COMMUNICATIONS USING A WIDEBAND RADIO AND SEPARABLE RADIO DEFINITION MODULE

FIELD OF THE INVENTION

The present invention relates to a system and method for flexible radio communications using a wideband radio, which is capable of operating over a broad range of the radio-frequency (RF) spectrum, and a plurality of separable radio definition modules, each of which is configured to operate in a subset of the RF spectrum.

BACKGROUND

Traditional approaches to radio communications in specific frequency bands of the RF spectrum have typically involved designing a radio to work only in that band. That is, traditional radios are designed with band specific filtering and hardware, which ensure reliable and robust communication in that specific frequency band, but preclude the radios from being used in any other frequency bands of the RF spectrum.

Modern radio transceiver hardware is capable of operating over a wide range of the RF spectrum with only software-configurable changes. However, to provide reliable and robust communications in a specific frequency band, the wideband radio transceiver hardware is augmented with band-specific filtering hardware. This, however, constrains the radio to operate only in the selected frequency band. In order to support robust communications in multiple frequency bands, traditional wideband radios must include the appropriate circuitry (for example, filters and switches) for each of the multiple frequency bands, despite being able to only use a single frequency selection at any one time. The support for multiple frequency bands typically results in the traditional wideband radio being impractical due to size and switching loss factors. Thus, performance is sacrificed in order to maintain flexibility in traditional wideband radios.

Antennas for communication that interface with these traditional wideband radios must be chosen to be compatible with the selected portion of the RF spectrum, and typically only comprise antenna elements and integrated amplifiers to improve system level noise performance. These radios also support integration with specific-use antennas, such as GPS antennas. Active GPS antennas typically comprise a radiating element, a low-noise amplifier (LNA), and a filter tuned to the frequency characteristics of GPS signals, whereas passive GPS antennas typically comprise only the radiating element. Both active and passive GPS antennas are explicitly designed only to receive GPS signals, and are not designed or enabled to receive other types of signals or transmit any signals.

SUMMARY

In contrast to the state of the art, the present invention employs a wideband radio capable of operating over a large swath of the RF spectrum, and a multitude of separable radio definition modules, each of which operates over a subset of the RF spectrum, that may be attached to the wideband radio to automatically enable its operation in the desired frequency band. Each of the separable radio definition modules comprises band-specific filtering capabilities. Upon attaching the separable radio definition module to the wideband radio, parameters associated with the specific frequency band are communicated to the wideband radio. The paradigm in the present invention maintains the capability of the wideband radio to operate over a large swath of the RF spectrum due to the exclusion of any band-specific filtering or hardware in the wideband radio, but enables its reliable and robust operation in any specific frequency band, simply by attaching a different separable radio definition module that comprises band-specific filtering for the required frequency band.

Thus, it is an object of the present invention to provide methods and systems, including computer program products, for flexible radio communication using a wideband radio. For example, in one embodiment, a method for flexible radio communications using a wideband radio comprises attaching one of a plurality of separable radio definition modules to the wideband radio, wherein the wideband radio is configured to operate in each of a plurality of frequency bands, wherein the one of the plurality of separable radio definition modules is configured to operate in a subset of the plurality of frequency bands, and wherein separability of the plurality of separable radio definition modules maintains a capability of the wideband radio to operate over the plurality of frequency bands and enables robust and reliable operation of the wideband radio in the subset of the plurality of frequency bands; communicating parameters associated with a frequency-selective filter in the one of the plurality of separable radio definition modules to a processor in the wideband radio, wherein characteristics of the frequency-selective filter correspond to the subset of the plurality of frequency bands; receiving the parameters at the processor; using the processor to program a transceiver circuit in the wideband radio to operate in the subset of the plurality of frequency bands; and transmitting and receiving radio-frequency signals using the wideband radio in the subset of the plurality of frequency bands.

These illustrative embodiments are mentioned not to limit or define the limits of the present subject matter, but to provide examples to aid in the understanding thereof. Illustrative embodiments are discussed in the Detailed Description, and further examples are provided there. Advantages offered by various embodiments may be further understood by examining this specification and/or by practicing one or more embodiments of the claimed subject matter.

Figure 1:
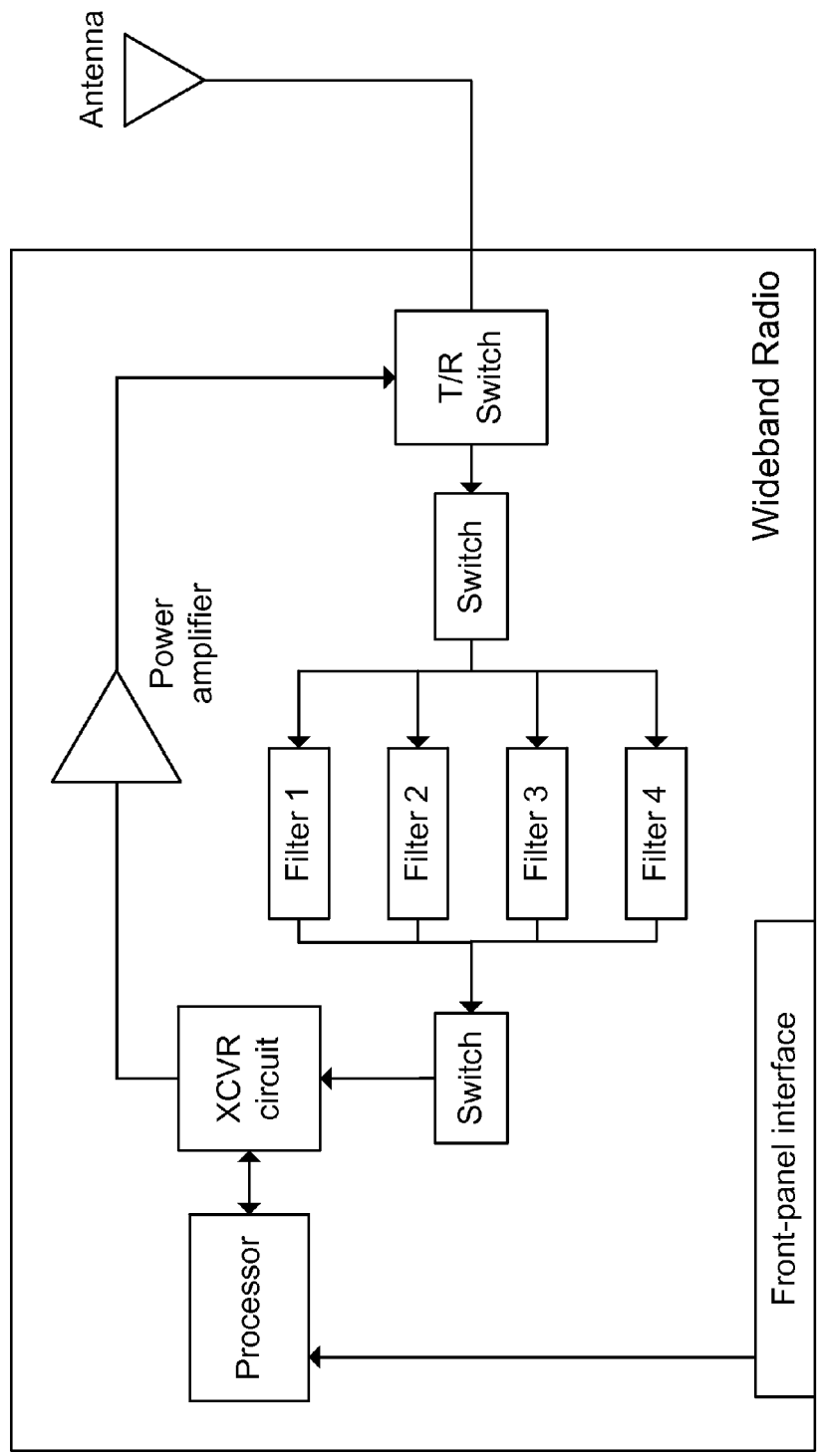
FIG. 1 is a block diagram of representative prior art for communications using a wideband radio that employs a wideband transceiver circuit and a filter bank to operate in a pre-defined subset of frequency bands.

Like labels are used to refer to the same or similar modules in the drawings.

DETAILED DESCRIPTION

Modern radio transceiver hardware is capable of operating over a broad range of frequencies. However, to ensure reliable and robust operation in specific frequency bands, traditional wideband radios integrate wideband transceivers with band-specific filtering. This achieves the communication objectives, but constrains the wideband radio to only operate in the specific frequency bands it was designed for.

FIG. 1 depicts a block diagram of representative prior art, wherein a traditional wideband radio comprises a processor, a wideband transceiver circuit that is capable of operating across a large swath of the RF spectrum, a filter bank to support robust and reliable communication across specific subsets of the RF spectrum, and a transmit/receive (T/R) switch connected to an antenna.

The transmit path of the traditional wideband radio comprises a power amplifier, and the receive path comprises the filter bank, which consists of band-specific filters that are designed to operate in specific subsets of the RF spectrum. A front panel interface, which is used to communicate mode or parameter information from the user to the processor, is typically used to switch between transmit and receive modes, and to determine which of the band-specific filters should currently be active. Thus, although the transceiver circuit is capable of operating across a large portion of the RF spectrum, the in-built band-specific filtering constrains the reliable and robust communication capabilities of the wideband radio to only those portions of the RF spectrum that the band-specific filters in the filter bank are designed for.

The present invention, described in the various embodiments herein, employs a distinct architecture in comparison to that depicted in FIG. 1 for traditional communications using a wideband radio. In contrast to constraining the wideband radio with specific band filtering that precludes the use of the wideband radio in other frequency bands, the present invention maintains the capability of the wideband radio to operate over the broad range of the RF spectrum by embedding the band-specific filtering into the separable radio definition module, which when attached to the wideband radio, automatically configures the wideband radio to reliably and robustly operate in the desired frequency band.

Figure 2:
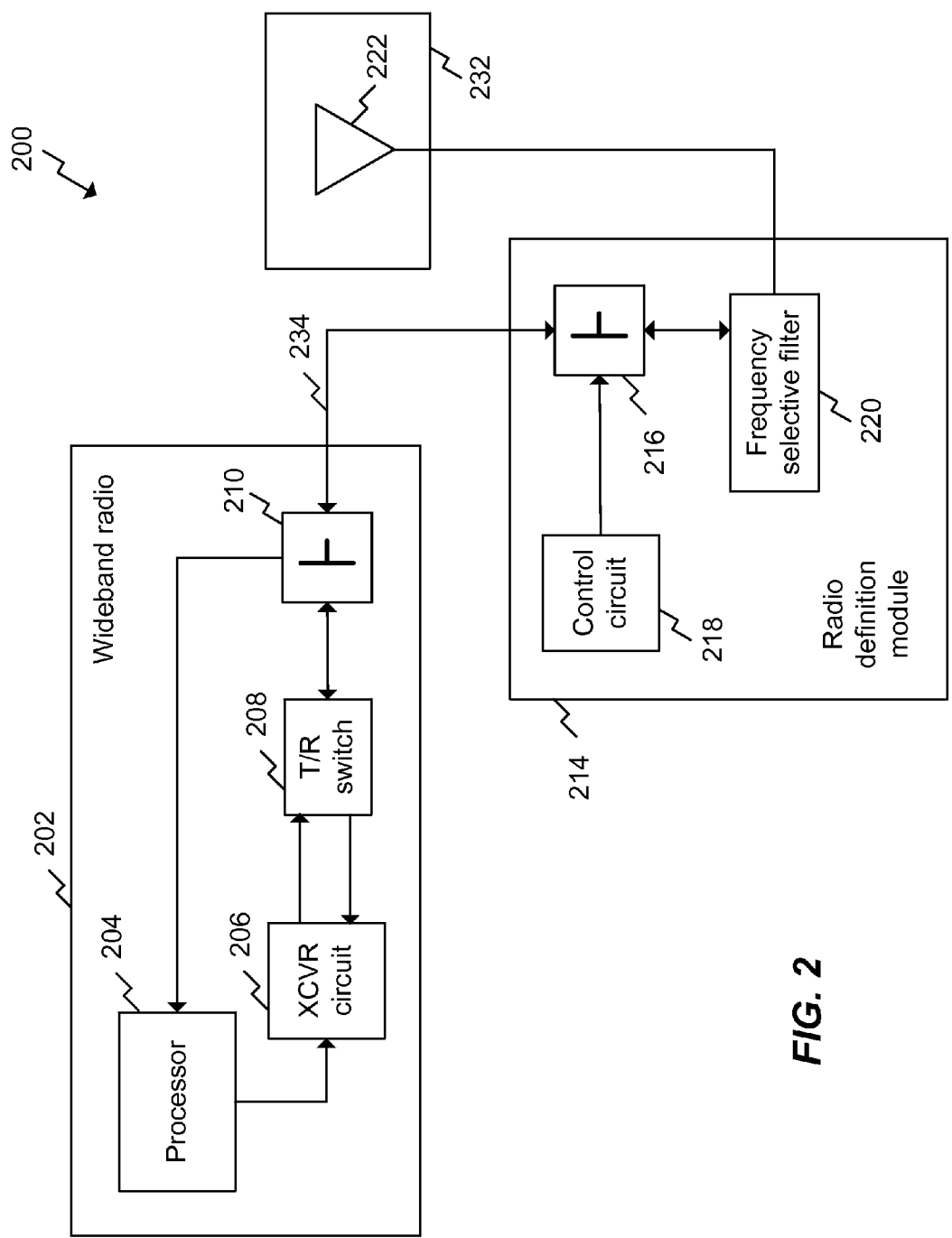
FIG. 2 is a block diagram of a first embodiment for flexible radio communications using a wideband radio, according to the present invention.

FIG. 2 depicts a first embodiment 200 for flexible radio communications using a wideband radio. The wideband radio 202 comprises a processor 204, a wideband transceiver circuit 206, a transmit/receive (T/R) switch 208, and a diplexer 210, and is capable of operating over a wide range of frequencies. In an embodiment, a separable radio definition module 214, which comprises a diplexer 216, a control circuit 218, and a frequency-selective filter 220, is attached to the wideband radio. The frequency-selective filter is capable of operating in a subset of frequencies, and attaching the separable radio definition module enables the wideband radio to operate reliably and robustly in that subset of frequencies. The separable radio definition module is connected to antenna 232, which comprises the antenna radiating element 222 and enables the transmission and reception of RF signals in the subset of frequencies.

In an embodiment, the separable radio definition module is attached to the wideband radio using a coaxial cable 234 that combines a control signal path and an RF signal path. The control signal path enables the wideband radio to provide both parasitic power and two-way communications between the processor and the control circuit. This coaxial cable is connected to the diplexers 210 and 216 in the wideband radio and separable radio definition module, respectively. In other embodiments, the control signal path and the RF signal path need not be combined.

Upon attaching the separable radio definition module 214 to the wideband radio 202, the control circuit 218 communicates parameters associated with the frequency-selective filter 220 to the processor 204 in the wideband radio. In an embodiment, the parameters communicated from the control circuit comprise the band of operation and/or a channel of operation within the subset of frequency bands. In another embodiment, the control circuit additionally communicates a parameter set that specifies the waveform for wideband radio operation. The parameter set may comprise one or more of a modulation type, an error-correction code type, and a coderate of the error-correction code type. After receiving the parameters, the processor programs the transceiver circuit to operate in the subset of frequency bands associated with the frequency-selective filter 220 in the radio definition module, with any optionally specified waveform parameters, and initiates reliable and robust communication via T/R switch 208 and antenna 232.

Figure 3:
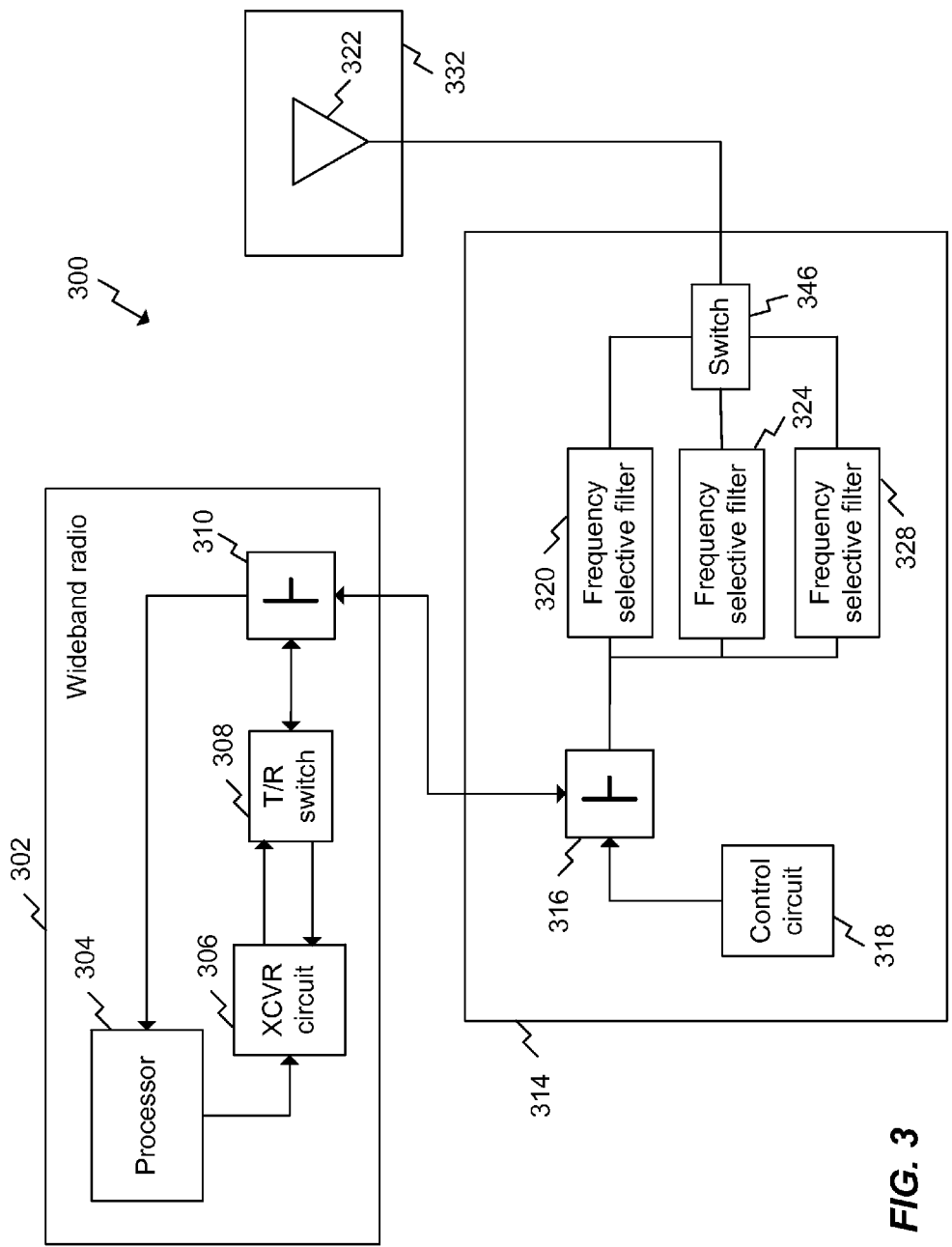
FIG. 3 is a block diagram of a second embodiment for flexible radio communications using a wideband radio, according to the present invention.

FIG. 3 depicts a second embodiment 300 for flexible radio communications using a wideband radio. This embodiment includes some features and/or components that are similar to those shown in FIG. 2 and described above. At least some of these features and/or components may not be separately described in this section. In this embodiment, the separable radio definition module 314 is configured to operate in three different subsets of the RF spectrum, therein necessitating frequency-selective filters 320, 324, and 328. The control circuit 318 and processor 304 are enabled to communicate via diplexers 316 and 310, respectively, to ensure that the appropriate frequency-selective filter is activated as required.

In an embodiment, at least one of frequency-selective filters 320, 324 or 328 can be an acoustic resonator filter. In an example, the frequency-selective filter may be a surface acoustic wave (SAW) filter. In other embodiments, the frequency-selective filters may be lumped-element filters, bulk acoustic wave (BAW) filters, stripline filters, or printed circuit board (PCB) implementations.

Figure 4:
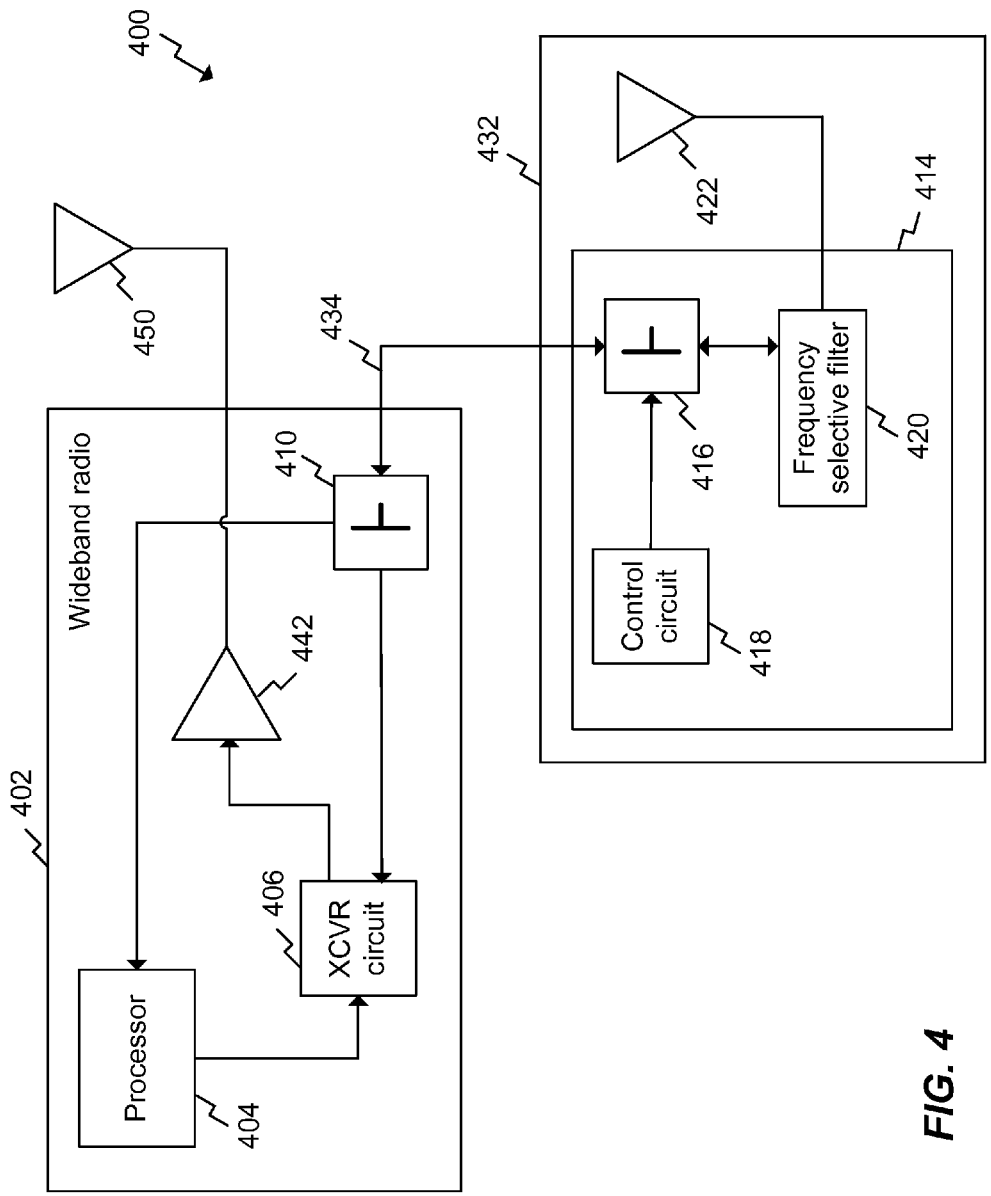
FIG. 4 is a block diagram of a third embodiment for flexible radio communications using a wideband radio, according to the present invention.

FIG. 4 depicts a third embodiment 400 for flexible radio communications using a wideband radio. This embodiment includes some features and/or components that are similar to those shown in FIGS. 2-3 and described above. At least some of these features and/or components may not be separately described in this section. In this embodiment, the wideband radio 402 has an additional antenna port which is attached to an antenna 450 via a power amplifier 442, which enables the wideband radio to transmit at higher signal power levels. Herein, a radio definition module 414 embedded in a separable antenna 432 is only used for signal reception, whereas the antenna 450 is used for signal transmission. In other embodiments, as shown in FIGS. 2-3, the radio definition module is connected to an antenna that is used for both transmitting and receiving signals.

Figure 5:
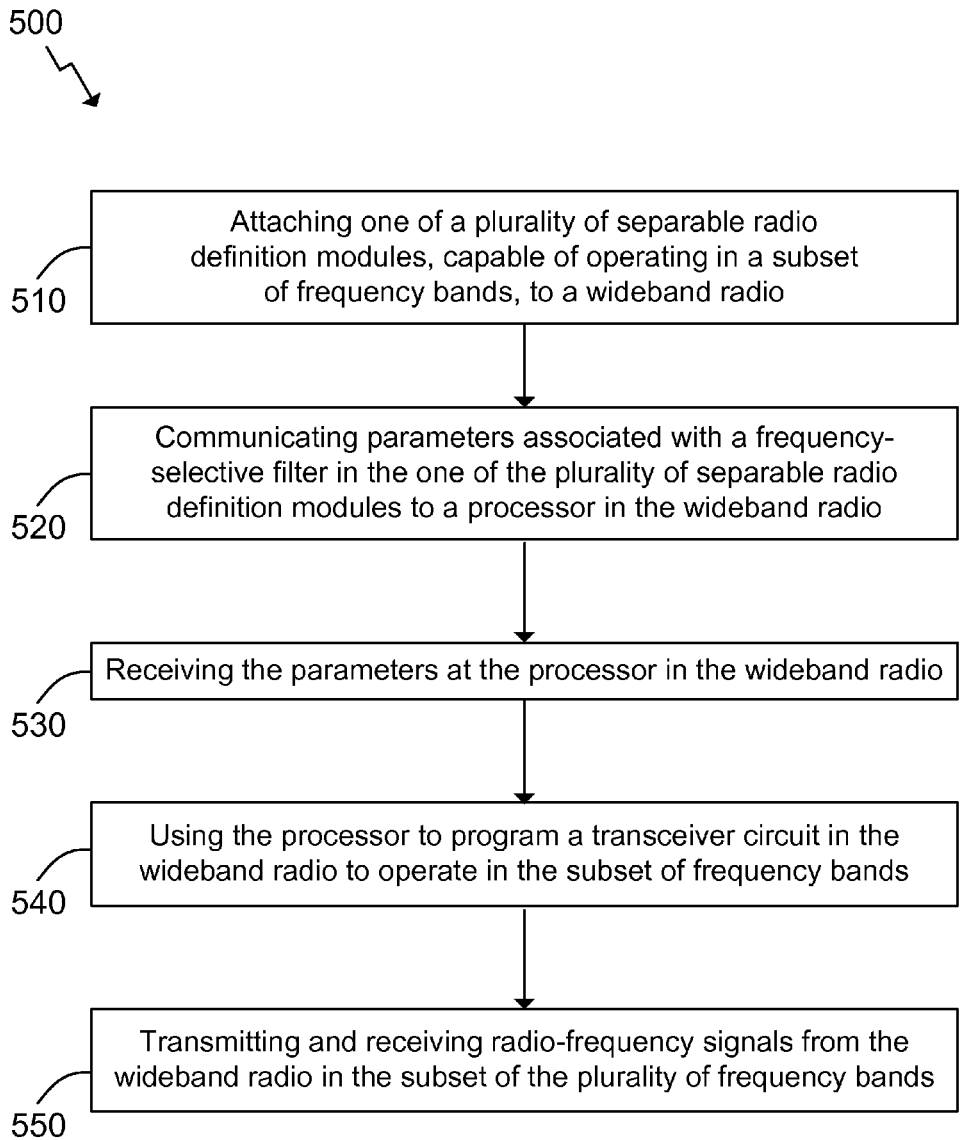
FIG. 5 is a flow chart for a method for flexible radio communications using a wideband radio, according to one embodiment of the present invention.

FIG. 5 is a flowchart for a method for flexible radio communications using a wideband radio, according to an embodiment of the present invention. In some embodiments, the order of steps in the flowchart may be changed. Furthermore, some of the steps in the flowchart may be skipped or additional steps added.

With reference to FIG. 2-4, the method 500 begins at step 510 when one of a plurality of separable radio definition modules is attached to a wideband radio, wherein the wideband radio is capable of operating over a large range of the RF spectrum, and each of the plurality of separable radio definition modules is capable of reliably and robustly operating over distinct subsets of the RF spectrum, and comprises frequency-selective filters that operate over the corresponding subsets of the RF spectrum.

At step 520, parameters associated with the frequency-selective filter in the attached separable radio definition module are communicated to a processor in the wideband radio.

The parameters may comprise a frequency band of operation and/or a channel within the frequency band. In other embodiments, parameters that define the waveform which the wideband radio should employ in the specified frequency band may be communicated to the processor.

At step 530, the parameters are received at the processor in the wideband radio. In an embodiment, the parameters are communicated from a control circuit in the separable radio definition module, and in another embodiment, the parameters are communicated from a user interface.

At step 540, the processor programs a wideband transceiver circuit in the wideband radio to operate reliably and robustly in the corresponding subsets of the RF spectrum, and to use any optionally specified parameters.

At step 550, the wideband radio may transmit and receive RF signals using the radio definition module and an antenna. In an embodiment, the separable radio definition module may be attached to an external antenna. In another embodiment, the radio definition module may be integrated with antenna circuitry or power amplifier circuitry.

Figure 6:
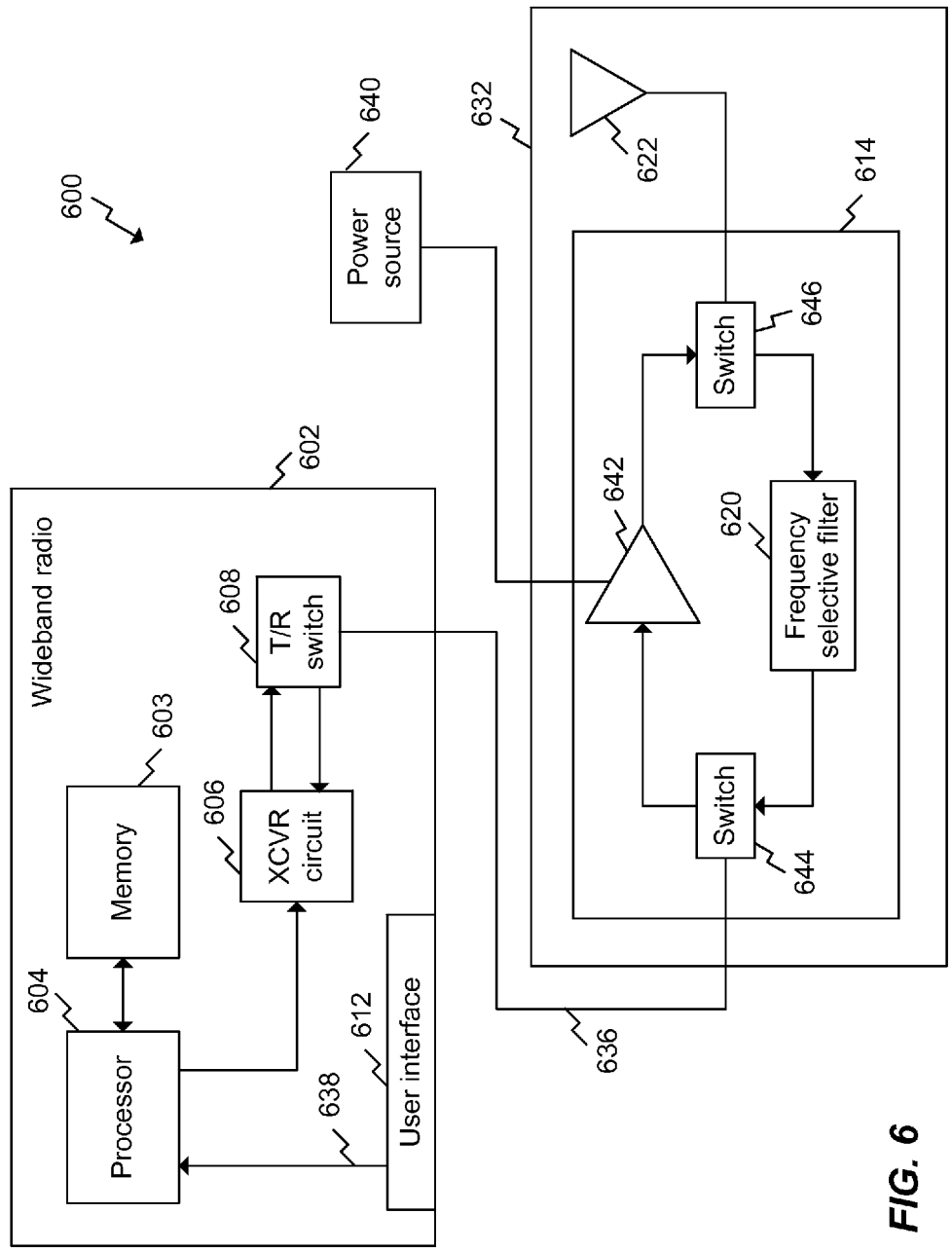
FIG. 6 is a block diagram of a fourth embodiment for flexible radio communications using a wideband radio, according to the present invention.

FIG. 6 depicts a fourth embodiment 600 for flexible radio communications using a wideband radio. This embodiment includes some features and/or components that are similar to those shown in FIGS. 2-4 and described above. At least some of these features and/or components may not be separately described in this section. In this embodiment, a radio definition module 614 is embedded within an antenna 632, parameters associated with the frequency-selective filter 620 are communicated from a user interface 612 to a processor 604 in the wideband radio 602, and the user interface may be a front-panel interface on the wideband radio. In another embodiment, the user interface used to communicate the parameters to the wideband radio may be a web-based interface. That is, upon attaching the antenna 632 with the embedded radio definition module 614 to the wideband radio via an RF signal path 636, a user may communicate the parameters, or a mode associated with the parameters, to the processor in order to enable the wideband radio to operate robustly and reliably in a subset of frequencies associated with characteristics of the frequency-selective filter.

In an embodiment, the embedded radio definition module 614 comprises distinct transmit and receive paths, with a power amplifier 642 and the frequency-selective filter 620, respectively. The use of the power amplifier in the embedded radio definition module necessitates the use of an external power source 640. Switches 644 and 646 enable the embedded radio definition module to transmit signals with higher power levels, and robustly receive signals using band-specific filtering in the frequency-selective filter 620. In addition to the embedded radio definition module 614, the antenna 632 further comprises an antenna element 622.

Attaching a separable antenna with an embedded radio definition module to the wideband radio enables the wideband radio to reliably communicate in the subset of frequencies associated with the frequency-selective filter in the embedded radio definition module. However, upon detaching the antenna, and attaching another antenna that comprises another embedded radio definition module that has a frequency-selective filter designed to operate in a different subset of frequencies, the wideband radio is now automatically configured to operate in the different subset of frequencies. Thus, the wideband radio is not constrained to operate in pre-defined portions of the RF spectrum as is the case in the current state of the art.

The processor 604 may comprise component digital processors, and may be configured to execute computer-executable program instructions stored in memory 603. For example, the component digital processors may execute one or more computer programs for enabling flexible communications using the wideband radio 602 in accordance with embodiments of the present invention.

Processor 604 may comprise a variety of implementations for programming a transceiver 606, communicating with the embedded radio definition module, and receiving one or more parameters, as well as a microprocessor, a digital signal processor (DSP), an application-specific integrated circuit (ASIC), one or more field programmable gate arrays (FPGAs), state machines, or the like. Processor 604 may further comprise a programmable electronic device such as a programmable logic controller (PLC), a programmable interrupt controller (PIC), a programmable logic device (PLD), a programmable read-only memory (PROM), an electronically programmable read-only memory (EPROM or EEPROM), or another similar device.

Memory 603 may comprise a non-transitory computer-readable medium that stores instructions which, when executed by the processor 604, cause the processor 604 to perform various steps, such as those described herein. Examples of computer-readable media include, but are not limited to, electronic, optical, magnetic, or other storage or transmission devices capable of providing the processor 604 with computer-readable instructions. Other examples of computer-readable media comprise, but are not limited to, a floppy disk, CD-ROM, magnetic disk, memory chip, ROM, RAM, ASIC, configured processor, any optical medium, any magnetic tape or other magnetic medium, or any other medium from which a computer processor can access data. In addition, various other devices may include a computer-readable medium such as a router, private or public network, or other transmission device. The processor 604 and the processing described may be in one or more structures, and may be dispersed throughout one or more structures.

Embodiments in accordance with aspects of the present subject matter can be implemented in digital electronic circuitry, computer hardware, firmware, software, or in combinations of the preceding. In one embodiment, a computer may comprise a processor or processors. A processor comprises or has access to a computer-readable medium, such as a random access memory (RAM) coupled to the processor.

While the present subject matter has been described in detail with respect to specific embodiments thereof, it will be appreciated that those skilled in the art, upon attaining an understanding of the foregoing, may readily produce modifications to, variations of, and equivalents to such embodiments. Accordingly, it should be understood that the present disclosure has been presented for purposes of example rather than limitation, and does not preclude inclusion of such modifications to, variations of and/or additions to the present subject matter as would be readily apparent to one of ordinary skill in the art.

What is claimed is:

1. A method for supporting flexible radio communications in a plurality of frequency bands using a wideband radio and a first separable radio definition module, the method comprising:

attaching the first separable radio definition module to the wideband radio, wherein the wideband radio is configured to operate in each of the plurality of frequency bands, wherein the first separable radio definition module is configured to operate in a first subset of the plurality of frequency bands, and wherein separability of the first separable radio definition module maintains a capability of the wideband radio to operate over the plurality of frequency bands while separated from the first separable radio definition module and enables improved operation of the wideband radio in the first subset of the plurality of frequency bands while attached to the first separable radio definition module;

communicating parameters associated with a first frequency-selective filter in the first separable radio definition module to a processor in the wideband radio, wherein characteristics of the first frequency-selective filter correspond to the first subset of the plurality of frequency bands;

receiving the parameters at the processor;

using the processor to program a transceiver circuit in the wideband radio to operate in the first subset of the plurality of frequency bands; and transmitting and receiving radio-frequency signals using the wideband radio in the first subset of the plurality of frequency bands.

2. The method of claim 1, the method further comprising:

detaching the first separable radio definition module from the wideband radio;

attaching a second separable radio definition module to the wideband radio, wherein the second separable radio definition module is configured to operate in a second subset of the plurality of frequency bands, and wherein the second subset is different from the first subset; and transmitting and receiving the radio-frequency signals using the wideband radio in the second subset of the plurality of frequency bands.

3. The method of claim 1, wherein the parameters associated with the first frequency-selective filter are communicated from a control circuit in the first separable radio definition module.

4. The method of claim 3, wherein the control circuit in the first separable radio definition module and the transceiver circuit in the wideband radio are integrated circuits.

5. The method of claim 1, wherein the parameters associated with the first frequency-selective filter are communicated from a user interface associated with the wideband radio.

6. The method of claim 2, wherein the wideband radio is further configured to operate using a plurality of parameter sets, wherein the processor is further configured to program the transceiver circuit to operate using a first of the plurality of parameter sets upon attaching the first separable radio definition module to the wideband radio, and wherein the processor is further configured to program the transceiver circuit to operate using a second of the plurality of parameter sets upon attaching the second separable radio definition module to the wideband radio.

7. The method of claim 6, wherein at least one of the plurality of parameter sets comprises a modulation type.

8. The method of claim 6, wherein at least one of the plurality of parameter sets comprises a modulation type, an error-correction code type, and a code-rate of the error-correction code type.

9. A system for supporting flexible radio communications in a plurality of frequency bands, the system comprising:

a wideband radio comprising a processor, a transceiver circuit, and a transmit/receive switch; and a plurality of separable radio definition modules each configured to be attached to the wideband radio, wherein each of the plurality of separable radio definition modules comprises a corresponding frequency-selective filter;

wherein the wideband radio is configured to operate in each of the plurality of frequency bands;

wherein each of the plurality of separable radio definition modules is configured to operate in a corresponding subset of the plurality of frequency bands;

wherein characteristics of the corresponding frequency-selective filter correspond to the corresponding subset of the plurality of frequency bands;

wherein, upon attaching one of the plurality of separable radio definition modules to the wideband radio, parameters associated with the corresponding frequency-selective filter are communicated to the processor in the wideband radio;

wherein, upon receiving the parameters, the processor is configured to program the transceiver circuit to operate in the corresponding subset of the plurality of frequency bands;

wherein, upon programming the transceiver circuit, the wideband radio is further configured to transmit and receive radio-frequency signals in the corresponding subset of the plurality of frequency bands via a radio-frequency signal path that connects the transmit/receive switch to the one of the plurality of separable radio definition modules; and wherein separability of the plurality of separable radio definition modules maintains a capability of the wideband radio to operate over the plurality of frequency bands while separated from the plurality of separable radio definition modules and enables improved operation of the wideband radio in the corresponding subset of the plurality of frequency bands while attached to the one of the plurality of separable radio definition modules.

10. The system of claim 9, wherein the one of the plurality of separable radio definition modules further comprises a corresponding control circuit, and wherein the parameters are communicated from the corresponding control circuit to the processor in the wideband radio via a control path.

11. The system of claim 10, wherein the wideband radio further comprises a diplexer, wherein the one of the plurality of separable radio definition modules further comprises a corresponding diplexer, wherein the control path and the radio-frequency signal path are combined in a common connection from the diplexer of the wideband radio to the corresponding diplexer of the one of the plurality of separable radio definition modules.

12. The system of claim 11, wherein the control path is a digital control signal from the wideband radio that provides both parasitic power and two-way communications to the corresponding control circuit in the one of the plurality of separable radio definition modules on the common connection.

13. The system of claim 10, wherein the corresponding control circuit in the one of the plurality of separable radio definition modules and the transceiver circuit in the wideband radio are integrated circuits.

14. The system of claim 9, wherein the one of the plurality of separable radio definition modules is embedded in an antenna, and wherein the antenna is connected to the transmit/receive switch in the wideband radio.

15. The system of claim 9, wherein the one of the plurality of separable radio definition modules is further connected to an antenna, and wherein the antenna is used to transmit and receive the radio-frequency signals.

16. The system of claim 9, wherein the system further comprises a user interface, and wherein the parameters are communicated from the user interface to the processor in the wideband radio.

17. The system of claim 9, wherein the corresponding frequency-selective filter is an acoustic resonator filter.

18. The system of claim 9, wherein the wideband radio is further configured to operate using a plurality of parameter sets, and wherein the processor is further configured to program the transceiver circuit to operate using one of the plurality of parameter sets upon attaching the one of the plurality of separable radio definition modules to the wideband radio.

19. The system of claim 18, wherein at least one of the plurality of parameter sets comprises one or more of a modulation type, an error-correction code type, and a code-rate of the error-correction code type.

20. A non-transitory tangible computer-readable medium embodying program code executable by a computing system upon attaching one of a plurality of separable radio definition modules to a wideband radio, the program code comprising:

program code for communicating parameters associated with a frequency-selective filter in the one of the plurality of separable radio definition modules to a processor in the wideband radio, wherein the wideband radio is configured to operate in each of a plurality of frequency bands, wherein the one of the plurality of separable radio definition modules is configured to operate in a subset of the plurality of frequency bands, wherein characteristics of the frequency-selective filter correspond to the subset of the plurality of frequency bands, and wherein separability of the plurality of separable radio definition modules maintains a capability of the wideband radio to operate over the plurality of frequency bands while separated from the plurality of separable radio definition modules and enables improved operation of the wideband radio in the subset of the plurality of frequency bands while attached to the one of the plurality of separable radio definition modules;

program code for receiving the parameters at the processor;

program code for using the processor to program a transceiver circuit in the wideband radio to operate in the subset of the plurality of frequency bands; and program code for transmitting and receiving radio-frequency signals using the wideband radio in the subset of the plurality of frequency bands.

\* \* \* \* \*